United States Patent
Wu et al.

(10) Patent No.: US 11,444,176 B2
(45) Date of Patent: Sep. 13, 2022

(54) STRUCTURE AND FORMATION METHOD OF SEMICONDUCTOR DEVICE STRUCTURE

(71) Applicant: Taiwan Semiconductor Manufacturing Company, Ltd., Hsinchu (TW)

(72) Inventors: Po-Chi Wu, Zhubei (TW); Chai-Wei Chang, New Taipei (TW); Kuo-Hui Chang, Gueishan Township (TW); Yi-Cheng Chao, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 34 days.

(21) Appl. No.: 16/505,917

(22) Filed: Jul. 9, 2019

(65) Prior Publication Data

US 2019/0334016 A1 Oct. 31, 2019

Related U.S. Application Data

(60) Continuation of application No. 16/417,780, filed on May 21, 2019, now Pat. No. 11,133,400, which is a division of application No. 14/818,965, filed on Aug. 5, 2015, now Pat. No. 10,411,113.

(60) Provisional application No. 62/165,369, filed on May 22, 2015.

(51) Int. Cl.
*H01L 29/66* (2006.01)
*H01L 29/78* (2006.01)
*H01L 29/49* (2006.01)

(52) U.S. Cl.
CPC .. *H01L 29/66553* (2013.01); *H01L 29/66545* (2013.01); *H01L 29/78* (2013.01); *H01L 29/4966* (2013.01)

(58) Field of Classification Search
CPC ......... H01L 29/66545; H01L 29/66553; H01L 21/823468; H01L 21/823864; H01L 29/6653; H01L 29/42376
See application file for complete search history.

(56) References Cited

U.S. PATENT DOCUMENTS

| 8,048,790 | B2 | 11/2011 | Soss et al. |
| 8,084,346 | B1 * | 12/2011 | Guo ................. H01L 29/66545 438/595 |
| 8,507,979 | B1 * | 8/2013 | Huang ................ H01L 29/4966 257/330 |
| 8,772,168 | B2 | 7/2014 | Xie et al. |
| 9,209,273 | B1 | 12/2015 | Lin et al. |

(Continued)

FOREIGN PATENT DOCUMENTS

| CN | 103972067 A | 8/2014 |
| KR | 20120089357 A | 8/2012 |
| KR | 20140104890 A | 8/2014 |

*Primary Examiner* — Peter M Albrecht
(74) *Attorney, Agent, or Firm* — Slater Matsil, LLP

(57) ABSTRACT

Structures and formation methods of a semiconductor device structure are provided. The semiconductor device structure includes a gate stack over a semiconductor substrate and a cap element over the gate stack. The cap element has an upper portion and a lower portion, and the upper portion is wider than the lower portion. The semiconductor device structure also includes a spacer element over a sidewall of the cap element and a sidewall of the gate stack.

20 Claims, 8 Drawing Sheets

(56) References Cited

U.S. PATENT DOCUMENTS

| | | |
|---|---|---|
| 2004/0135212 A1 | 7/2004 | Dokumaci et al. |
| 2006/0006478 A1 | 1/2006 | Kanegae et al. |
| 2009/0302398 A1 | 12/2009 | Sell et al. |
| 2010/0052075 A1 | 3/2010 | Yeh et al. |
| 2011/0073957 A1 | 3/2011 | Chiu et al. |
| 2011/0156107 A1 | 6/2011 | Bohr et al. |
| 2013/0078791 A1* | 3/2013 | Xie ............... H01L 29/4966 438/586 |
| 2013/0178033 A1 | 7/2013 | Bohr et al. |
| 2013/0187236 A1 | 7/2013 | Xie et al. |
| 2013/0189834 A1 | 7/2013 | Ramachandran et al. |
| 2014/0070320 A1 | 3/2014 | Mukherjee et al. |
| 2014/0179093 A1 | 6/2014 | Choi et al. |
| 2014/0203333 A1 | 7/2014 | Huang et al. |
| 2014/0217482 A1 | 8/2014 | Xie et al. |
| 2014/0231885 A1 | 8/2014 | Xie et al. |
| 2014/0299939 A1* | 10/2014 | Kim ............... H01L 21/02697 257/369 |
| 2014/0374805 A1 | 12/2014 | Wu et al. |
| 2015/0041905 A1 | 2/2015 | Xie et al. |
| 2015/0054029 A1* | 2/2015 | Jangjian ........... H01L 21/02183 257/190 |
| 2015/0061027 A1 | 3/2015 | Hong et al. |
| 2015/0069535 A1 | 3/2015 | Chang et al. |
| 2015/0118835 A1* | 4/2015 | Lin ............... H01L 21/28247 438/586 |
| 2015/0118836 A1 | 4/2015 | Lin et al. |
| 2015/0187946 A1* | 7/2015 | Park ............... H01L 29/66795 257/368 |
| 2015/0255542 A1 | 9/2015 | Cai et al. |
| 2016/0240624 A1 | 8/2016 | Zhu |

\* cited by examiner

STRUCTURE AND FORMATION METHOD OF SEMICONDUCTOR DEVICE STRUCTURE

PRIORITY CLAIM AND CROSS-REFERENCE

This Application is a continuation of U.S. application Ser. No. 16/417,780, filed on May 21, 2019, which is a division of U.S. application Ser. No. 14/818,965, filed on Aug. 5, 2015, which claims the benefit of U.S. Provisional Application No. 62/165,369, filed on May 22, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
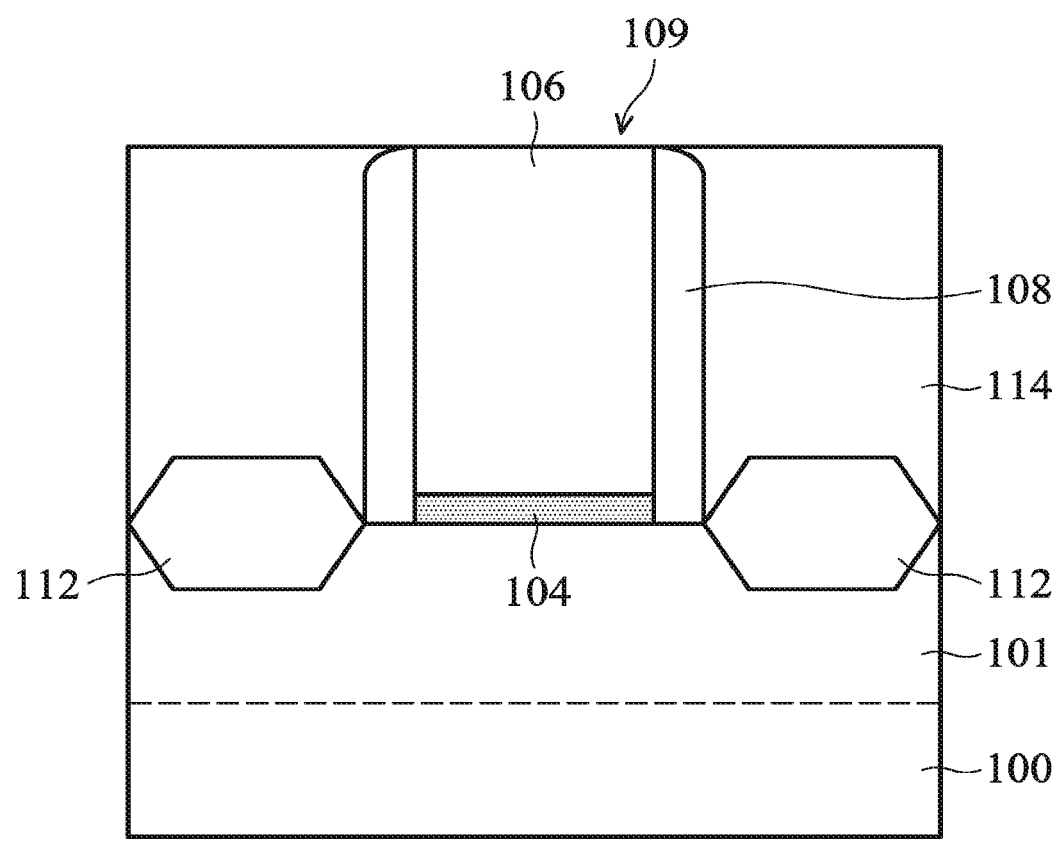
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, one or multiple fin structures are formed. As shown in FIG. 1A, one of the fin structures (the fin structure 101) is shown. In some embodiments, multiple recesses (or trenches) (not shown) are formed in the semiconductor substrate 100. As a result, multiple fin structures including a fin structure 101 are formed between the recesses. In some embodiments, one or more photolithography and etching processes are used to form the recesses.

As shown in FIG. 1A, isolation features (not shown) are formed in the recesses to surround a lower portion of the fin structure 101, in accordance with some embodiments. The isolation features are used to define and electrically isolate various device elements formed in and/or over the semiconductor substrate 100. In some embodiments, the isolation features include shallow trench isolation (STI) features, local oxidation of silicon (LOCOS) features, other suitable isolation features, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (PSG), low-K dielectric material, another suitable material, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features.

In some embodiments, a dielectric material layer is deposited over the semiconductor substrate 100. The dielectric material layer covers the fin structures including the fin structure 101 and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structure 101 is exposed. The planarization process may include a chemical mechanical polishing (CMP) process, a grinding process, an etching process, another applicable process, or a combination thereof. Afterwards, the dielectric material layer is etched back to below the top of the fin structure 101. As a result, the isolation features are formed. The fin structures including the fin structure 101 protrude from the isolation features, in accordance with some embodiments.

As shown in FIG. 1A, a gate dielectric layer 104 is deposited over the isolation features and the fin structure 101, in accordance with some embodiments. In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will subsequently be removed. In some other embodiments, the gate dielectric layer 104 is not formed.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof.

Afterwards, a gate electrode 106 is formed over the gate dielectric layer 104 to cover a portion of the fin structure 101, as shown in FIG. 1A in accordance with some embodiments. In some embodiments, the gate electrode 106 is a dummy gate electrode which will be replaced with a metal gate electrode. In some embodiments, the gate electrode 106 is made of polysilicon. In some embodiments, the portion of the fin structure 101 under the gate electrode 101 serves as a channel region of a transistor that will be formed.

In some embodiments, a gate electrode layer is deposited over the gate dielectric layer 104 using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer may be used to pattern the gate electrode layer into one or more gate electrodes including the gate electrode 106 shown in FIG. 1A. In some embodiments, the gate dielectric layer 104 is also patterned, as shown in FIG. 1A. The gate electrode 106 and the gate dielectric layer 104 may together form a gate stack 109.

In some embodiments, the gate stack 109 is a dummy gate stack and will be replaced with a metal gate stack. In some embodiments, the gate stack 109 surrounds side surfaces and a top surface of the fin structure 101 and further extends over the semiconductor substrate 100.

In some embodiments, the patterned hard mask layer includes a first hard mask layer and a second hard mask layer. The first hard mask layer is between the gate electrode layer and the second hard mask layer. In some embodiments, the first hard mask layer is made of silicon nitride. In some embodiments, the second hard mask layer is made of silicon oxide. In some embodiments, the second hard mask layer is thicker than the first mask layer.

In some embodiments, sealing elements (not shown) are formed over sidewalls of the gate stack 109. The sealing elements may be used to protect the gate stack 109 and/or assist in a subsequent process for forming lightly-doped source/drain (LDS/D) regions. In some embodiments, an ion implantation process is used to form the LDS/D regions. In some other embodiments, the sealing elements are not formed. In some other embodiments, the LDS/D regions are not formed.

Afterwards, spacer elements 108 are formed over sidewalls of the gate stack 109, as shown in FIG. 1A in accordance with some embodiments. The spacer elements 108 may be used to protect the gate stack 109 and/or assist in a subsequent process for forming source/drain features. In some embodiments, the spacer elements 108 are made of a dielectric material. The dielectric material may include silicon nitride, silicon oxynitride, silicon oxide, another suitable material, or a combination thereof.

In some embodiments, a dielectric material layer is deposited over the semiconductor substrate 100 and the gate stack 109. The dielectric material layer may be deposited using a CVD process, an ALD process, a spin-on process, another applicable process, or a combination thereof. Afterwards, the dielectric material layer is partially removed using an etching process, such as an anisotropic etching process. As a result, the remaining portions of the dielectric material layer over the sidewalls of the gate stack 109 form the spacer elements 108.

As shown in FIG. 1A, source/drain features 112 are formed over the portions of the fin structure 101 near the gate stack 109, in accordance with some embodiments. In some embodiments, the fin structure 101 is partially removed to form recesses near the spacer elements 108. Afterwards, an epitaxial growth process is performed to form the source/drain features 112, as shown in FIG. 1A in accordance with some embodiments. In some embodiments, the source/drain features 112 are also used as stressors that can apply strain or stress on the channel region between the source/drain features 112. The carrier mobility may be improved accordingly.

As shown in FIG. 1A, a dielectric layer 114 is formed to surround the gate stack 109, in accordance with some embodiments. In some embodiments, a dielectric material layer is deposited to cover the source/drain features 112, the spacer elements 108, and the gate stack 109. Afterwards, a planarization process is used to partially remove the dielectric material layer. The dielectric material layer may be partially removed until the gate electrode 106 is exposed. As a result, the dielectric layer 114 is formed.

In some embodiments, the dielectric material layer is made of silicon oxide, silicon oxynitride, borosilicate glass (BSG), phosphoric silicate glass (PSG), borophosphosilicate glass (BPSG), fluorinated silicate glass (PSG), low-k material, porous dielectric material, another suitable material, or a combination thereof. In some embodiments, the dielectric material layer is deposited using a CVD process, an ALD process, a spin-on process, another applicable process, or a combination thereof. In some embodiments, the planarization process includes a CMP process, a grinding process, an etching process, another applicable process, or a combination thereof.

Afterwards, multiple etching operations are performed to remove the gate electrode 106, in accordance with some embodiments. In some embodiments, these etching operations are performed within a same process chamber.

Figure 1B:
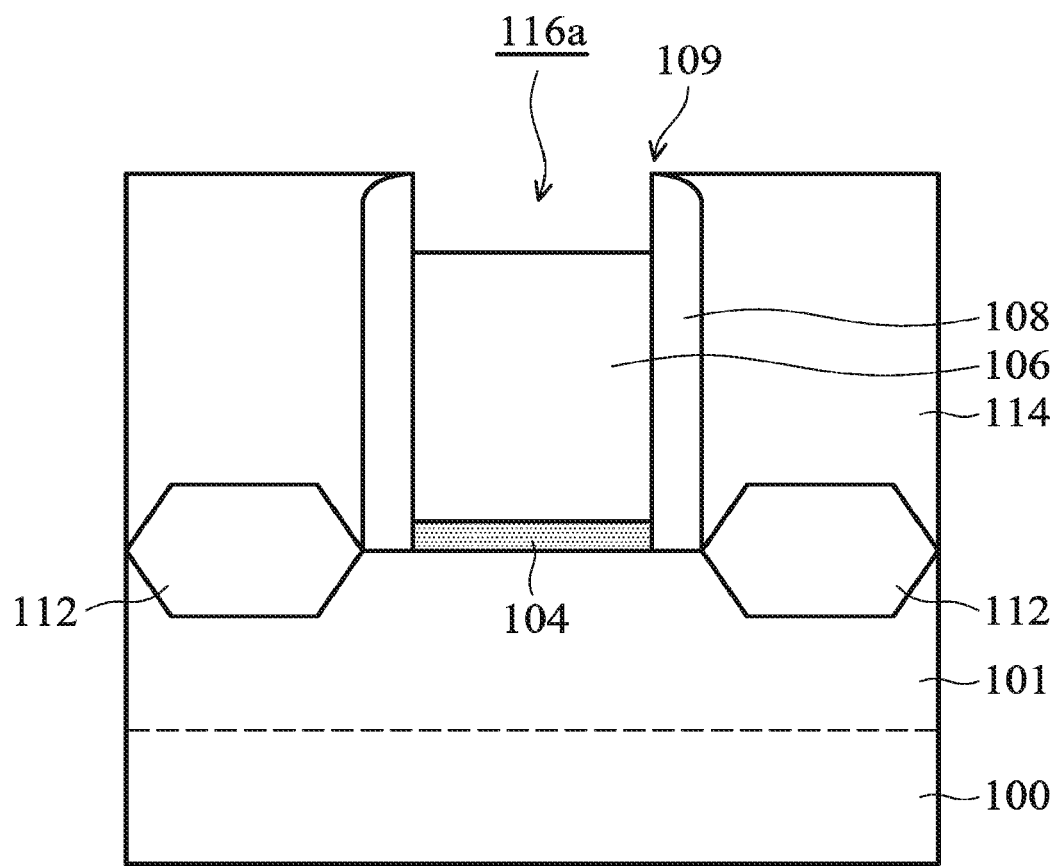

As shown in FIG. 1B, a portion of the gate electrode 106 is removed to form a recess 116a in a first etching operation, in accordance with some embodiments. The recess 116a is surrounded by the spacer elements 108 and the gate electrode 106 remained between the spacer elements 108. In some embodiments, the recess 116a has a depth that is in a range from about 10 nm to about 20 nm. In some cases, the spacer elements 108 may slightly collapse towards the recess 116a after the partial removal of the gate electrode 106. As a result, the opening of the recess 116a becomes smaller.

In some embodiments, the first etching operation involves plasma. In some embodiments, the reaction gas used in the first etching operation includes HBr, $Cl_2$, another similar gas, another suitable gas, or a combination thereof.

Figure 1C:
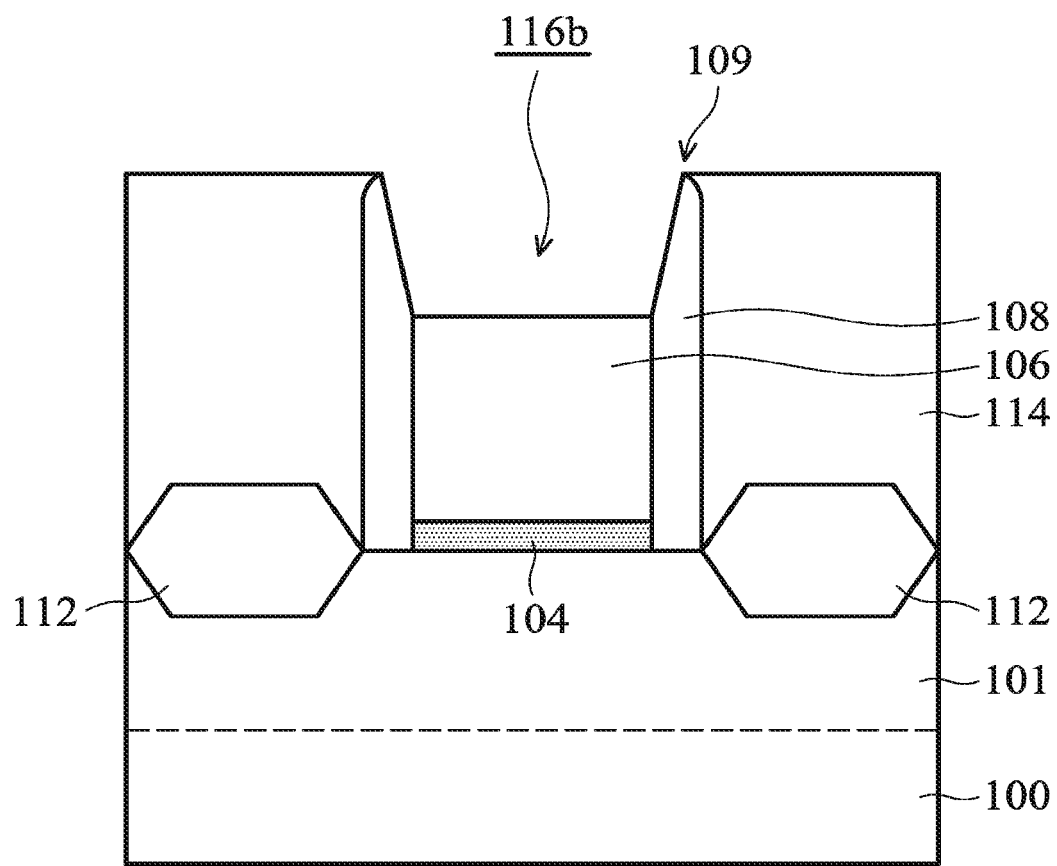

As shown in FIG. 1C, a portion of the gate electrode 106 is further removed and the spacer elements 108 are also laterally etched in a second etching operation, in accordance with some embodiments. In some embodiments, an etching rate of the first etching operation to the spacer elements 108 is lower than an etching rate of the second etching operation to the spacer elements 108.

After the second etching operation, the recess (116a) becomes deeper and is denoted as 116b. In some embodiments, the recess 116b has a depth that is in a range from about 20 nm to about 35 nm. In some embodiments, the recess 116b becomes wider along a direction from a bottom of the recess 116b towards a top of the recess 116b, as shown in FIG. 1C.

In some embodiments, the condition of the second etching operation is fine-tuned to laterally etch upper portions of the spacer elements 108, as shown in FIG. 1C. In some embodiments, the second etching operation involves plasma. In some embodiments, the reaction gas used in the second etching operation includes $CHF_3$, HBr, $O_2$, Ar, He, another similar gas, another suitable gas, or a combination thereof. In some embodiments, a volumetric concentration of $CHF_3$ is in a range from about 50% to about 90%. In some embodiments, a volumetric concentration of HBr is in a range from about 20% to about 30%. In some embodiments, a volumetric concentration of $O_2$ is in a range from about 10% to about 40%.

Due to the laterally etching of the spacer elements 108, the recess 116b has a larger opening. In some embodiments, the recess 116b has a slanted sidewall. In some other embodiments, the recess 116b has curved sidewalls. In some embodiments, widths of the recess 116b gradually increase along a direction from a bottom of the recess 116b towards the top of the recess 116b. In some embodiments, the recess 116b gradually becomes larger along a direction from a top of the gate electrode 106 towards the top of the recess 116b.

Figure 1D:
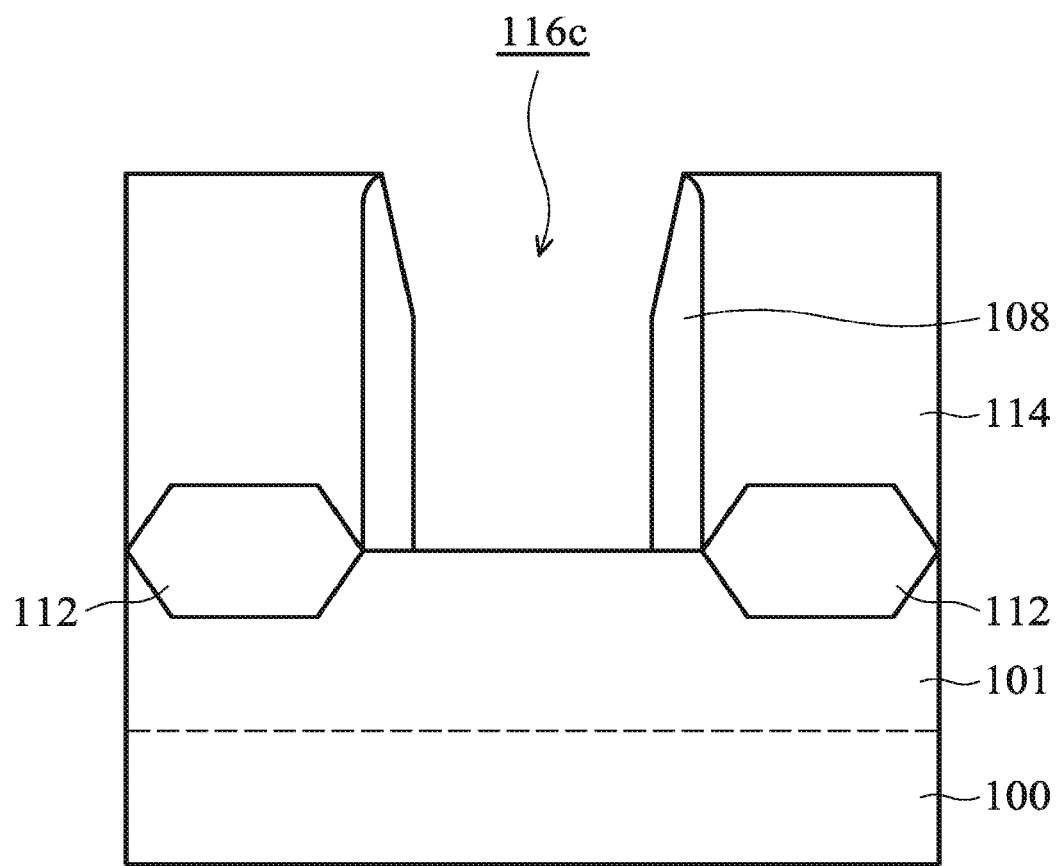

As shown in FIG. 1D, the remaining portion of the gate electrode 106 is further removed in a third etching operation, in accordance with some embodiments. In some embodiments, an etching rate of the second etching operation to the spacer elements 108 is higher than an etching rate of the third etching operation to the spacer elements 108. In some embodiments, the spacer elements 108 are substantially not removed during the third etching operation.

After the third etching operation, the recess (116b) becomes deeper and denoted as 116c. In some embodiments, the recess 116c has a depth that is in a range from about 60 nm to about 85 nm. Afterwards, the gate dielectric layer 104 is removed, in accordance with some embodiments. The recess 116c exposes the fin structure 101, as shown in FIG. 1D.

In some embodiments, the third etching operation involves plasma. In some embodiments, the reaction gas used in the third etching operation includes HBr, $Cl_2$, another similar gas, another suitable gas, or a combination thereof. In some other embodiments, one or more other etching operations are performed before, during, between, and/or after the first, the second, and the third etching operations.

Figure 1E:
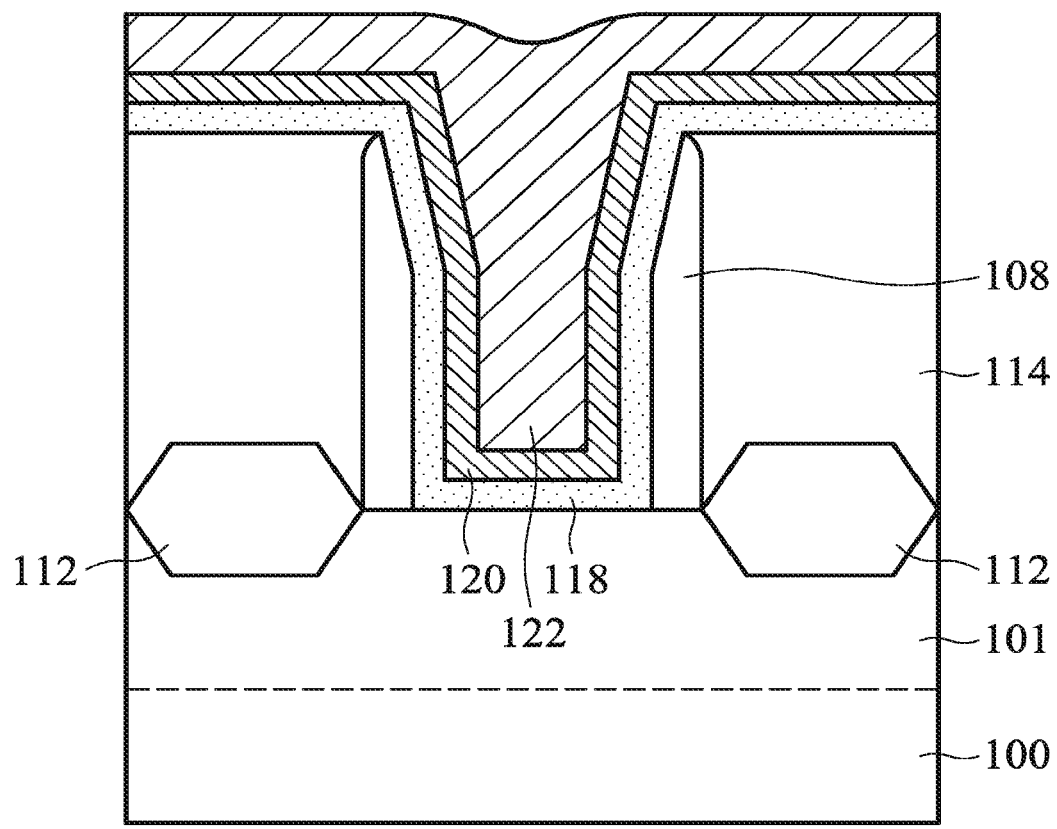

As shown in FIG. 1E, metal gate stack layers are deposited to fill the recess 116c (or trench) between the spacer elements 108, in accordance with some embodiments. The metal gate stack layers may include a gate dielectric layer 118, a work function layer 120, and a conductive filling layer 122. One or more other layers may be formed between the metal gate stack layers. For example, a barrier layer is formed between the gate dielectric layer 118 and the work function layer 120. A blocking layer may be formed between the work function layer 120 and the conductive filling layer 122. In some embodiments, the filling of the metal gate stack layers becomes easier since the recess 116c is widened (compared with the recess 116a shown in FIG. 1B) after the etching operations mentioned above.

In some embodiments, the gate dielectric layer 118 is made of a dielectric material with high dielectric constant (high-K). The gate dielectric layer 118 may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layer 120 is used to provide the desired work function for transistors to enhance device performance, such as improved threshold voltage. In some embodiments, the work function layer 120 is an n-type metal layer capable of providing a work function value suitable for the device, such as equal to or less than about 4.5 eV. In some embodiments, the work function layer 120 is a p-type metal layer capable of providing a work function value suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 120 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 120 may be fine-tuned to adjust the work function level. For example, a titanium nitride layer may be used as a p-type metal layer or an n-type metal layer, depending on the thickness and/or the compositions of the titanium nitride layer.

In some embodiments, the conductive filling layer 122 is made of a metal material. The metal material may include tungsten, aluminum, copper, another suitable material, or a combination thereof. The formation of the metal gate stack layers may involve multiple deposition processes. The deposition processes may include a CVD process, an ALD process, a PVD process, an electroplating process, an electroless plating process, a spin-on process, another applicable process, or a combination thereof.

Figure 1F:
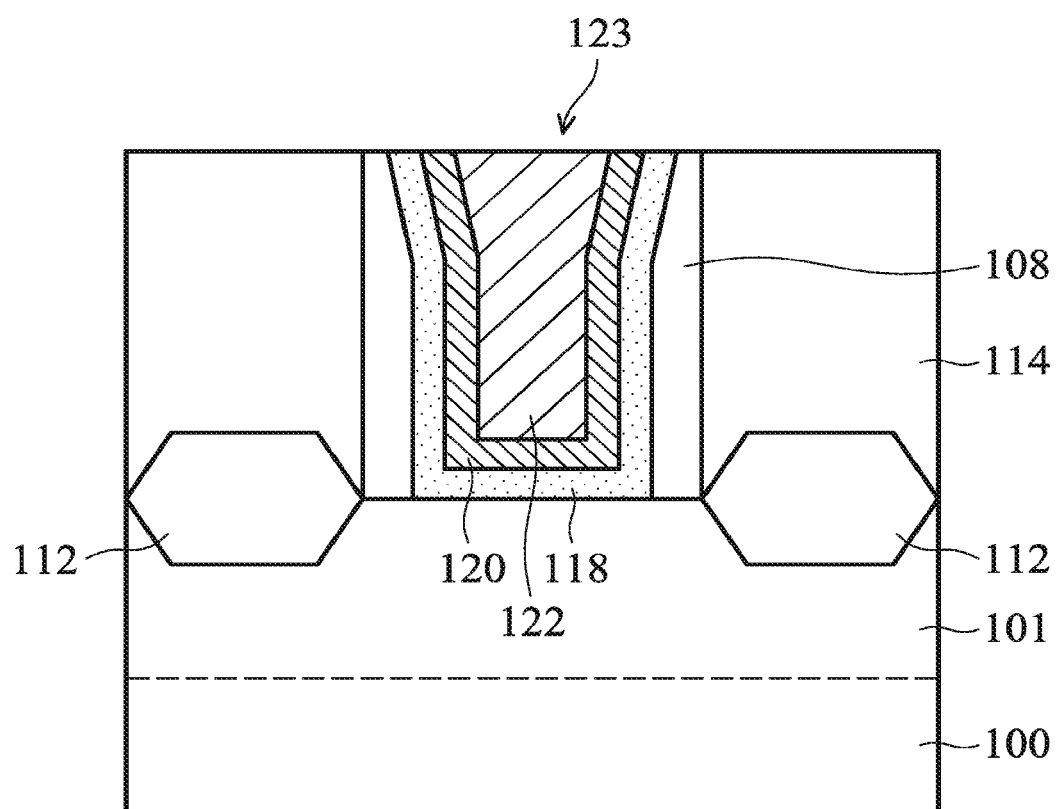

As shown in FIG. 1F, a planarization process is performed to remove the portions of the metal gate stack layers outside of the recess (or trench) between the spacer elements 108, in accordance with some embodiments. As a result, a metal gate stack 123 is formed. The metal gate stack 123 includes the gate dielectric layer 118, the work function layer 120, and a gate electrode 122' (such as a metal gate electrode) that is a portion of the conductive filling layer 122.

Figure 1G:
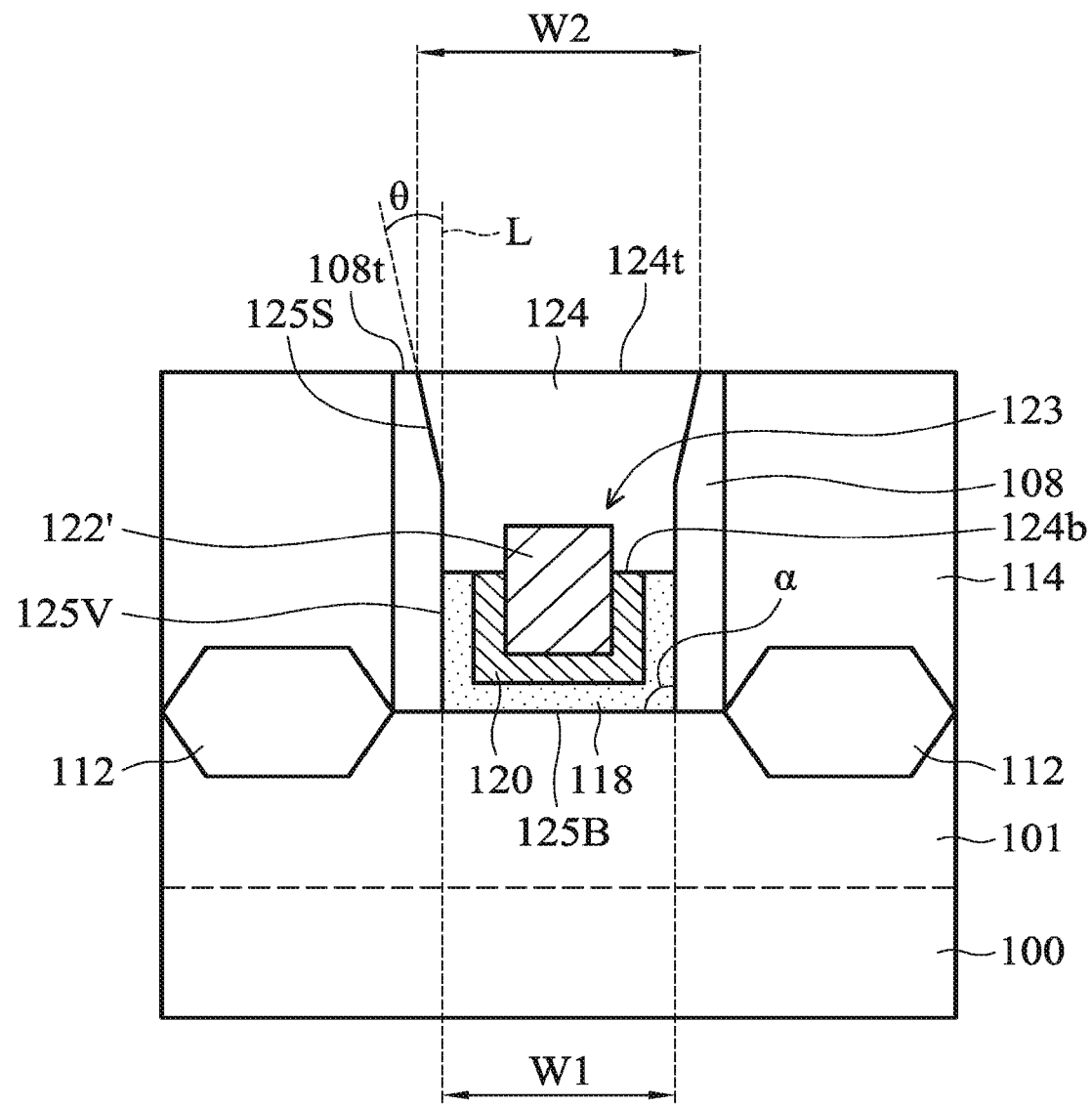

As shown in FIG. 1G, the metal gate stack 123 is etched back, in accordance with some embodiments. In some embodiments, the gate electrode 122' protrudes from top surfaces of the work function layer 120 and/or the gate dielectric layer 118 after the etching back process.

In some embodiments, because the spacer elements 108 are laterally etched to provide a recess having a larger opening. Therefore, the etching process for etching back the metal gate stack 123 may be performed well due to the larger opening. The subsequent formation of a cap element and a subsequent process for forming a conductive contact to the metal gate stack 123 are significantly improved.

Afterwards, a cap element 124 is formed over the metal gate stack 123 that is etched back, as shown in FIG. 1G in accordance with some embodiments. In some embodiments, the cap element 124 is in direct contact with the metal gate stack 123. In some embodiments, the cap element 124 is in direct contact with the gate electrode 122'. In some embodiments, the cap element 124 is in direct contact with the work function layer 120. In some embodiments, the cap element 124 is in direct contact with the gate dielectric layer 118. In some embodiments, the cap element 124 is in direct contact with the spacer elements 108. In some embodiments, the gate electrode 122' penetrates into the cap element 124. In some embodiments, the cap element 124 surrounds an upper portion of the gate electrode 122'. In some embodiments, the cap element 124 continuously surrounds an upper portion of the gate electrode 122'.

In some embodiments, the cap element 124 is made of a dielectric material. The dielectric material may include silicon nitride, silicon oxynitride, another suitable material, or a combination thereof. In some embodiments, a protection material layer (such as a dielectric layer) is deposited over the dielectric layer 114, the spacer elements 108, and the metal gate stack 123 that is etched back. In some embodiments, the protection material layer is made of a dielectric material. The dielectric material may include silicon nitride, silicon oxynitride, silicon carbide, silicon carbon nitride, oxide, another similar material, another suitable material, or a combination thereof. In some embodiments, the protection material layer is deposited using a CVD process, an ALD process, a spin-on process, another applicable process, or a combination thereof.

Afterwards, the portion of the protection material layer outside of the recess between the spacer elements 108 is removed, in accordance with some embodiments. As a result, the remaining portion of the protection material layer forms the cap element 124, as shown in FIG. 1G. In some embodiments, a planarization process is used to partially remove the protection material layer to achieve the formation of the cap element 124. In some embodiments, the planarization process includes a chemical mechanical polishing (CMP) process, a grinding process, an etching process, another applicable process, or a combination thereof.

As shown in FIG. 1G, the cap element 124 has a top 124t and a bottom 124b. The cap element 124 has a first width $W_1$ near the metal gate stack 123 (or the bottom 124b) and a second width $W_2$ near the top 124t of the cap element 124. The width $W_2$ is greater than the width $W_1$. In some embodiments, the first width $W_1$ is in a range from about 25 nm to about 35 nm. In some embodiments, the second width $W_2$ is in a range from about 27 nm to about 37 nm. In some embodiments, the cap element 124 has an upper portion and a lower portion. The upper portion is wider than the lower portion, as shown in FIG. 1G.

In some embodiments, the cap element 124 gradually becomes narrower along a direction from the top 124t towards the bottom 124b of the cap element 124. In some embodiments, the cap element 124 gradually becomes narrower along a direction from the top 124t towards the metal gate stack 123. In some embodiments, the spacer element 108 gradually becomes narrower along a direction from the bottom 124b of the cap element 124 towards a top 108t of the spacer element 108.

As shown in FIG. 1G, there is an angle α between a bottom 125B and a sidewall 125V of the metal gate stack 123. In some embodiments, the angle α should be carefully controlled to be within a suitable range. In some embodiments, the angle α is in a range from about 85 degrees to about 95 degrees. As shown in FIG. 1G, there is an angle θ between a sidewall 125S of the cap element 124 and an imaginary plane L extending from the sidewall 124V of the metal gate stack 123 towards the top 124t of the cap element 124. In some embodiments, the angle θ should be carefully controlled to be within a suitable range. In some embodiments, the angle θ is in a range from about 1 degree to about 10 degrees.

Figure 2:
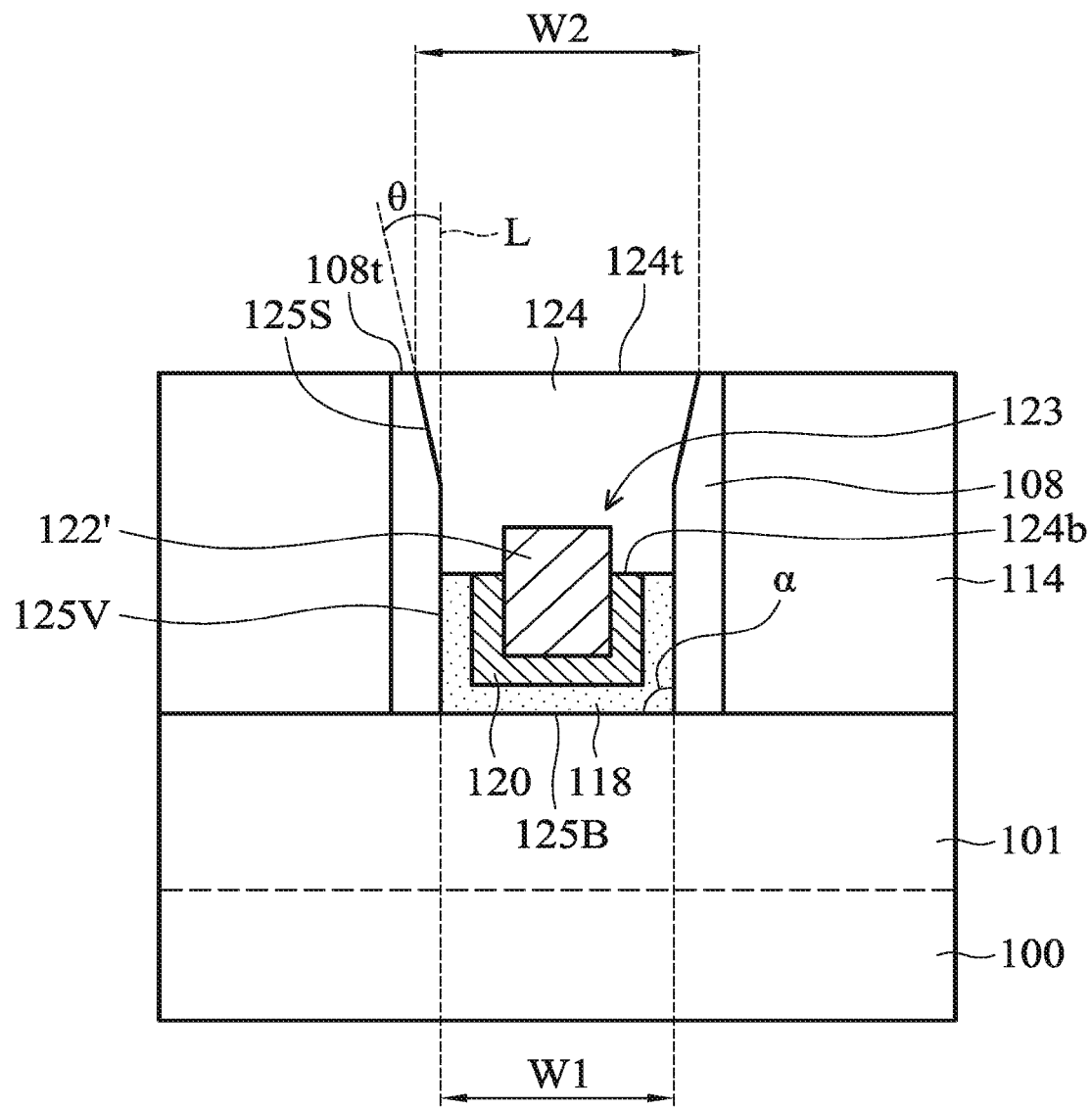
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. Like reference numbers are used to designate like elements. In some embodiments, the source/drain features are doped regions formed within the fin structure 101. In some other embodiments, the fin structure 101 is not formed. In these cases, the source/drain features are doped regions formed in the semiconductor substrate 100.

Embodiments of the disclosure form a semiconductor device structure having a gate stack with spacer elements over sidewalls of the gate stack. Upper portions of the spacer elements and the gate stack are partially removed to form a recess over the gate stack and between the spacer elements. The recess has a wider upper portion than a lower portion of the recess. Afterwards, a remaining portion of the gate stack is removed. Afterwards, a metal gate stack is formed in the recess and then etched back. A cap element is then formed over the metal gate stack and between the spacer elements. Due to the profile of the recess, the qualities of the processes of the removal of the remaining portion of the gate stack, the formation of the metal gate stack, the etching back of the metal gate stack, and the formation of the cap element are improved.

In accordance with some embodiments, a semiconductor device structure is provided. The semiconductor device structure includes a gate stack over a semiconductor substrate and a cap element over the gate stack. The cap element has an upper portion and a lower portion, and the upper portion is wider than the lower portion. The semiconductor device structure also includes a spacer element over a sidewall of the cap element and a sidewall of the gate stack.

In accordance with some embodiments, a semiconductor device structure is provided. The semiconductor device structure includes a gate stack over a semiconductor substrate. The semiconductor device structure also includes a cap element over the gate stack, and the cap element has a first width near the gate stack and a second width near an upper portion of the cap element. The second width is greater than the first width. The semiconductor device structure further includes a spacer element over a sidewall of the cap element and a sidewall of the gate stack.

In accordance with some embodiments, a method for forming a semiconductor device structure is provided. The method includes forming a gate electrode over a semiconductor substrate and forming spacer elements over sidewalls of the gate electrode. The method also includes partially removing the gate electrode and the spacer elements to form a recess between the spacer elements. The recess becomes wider along a direction from a bottom of the recess towards a top of the recess. The method further includes removing a remaining portion of the gate electrode such that the recess becomes deeper. In addition, the method includes forming a metal gate stack in the recess after the remaining portion of the gate electrode is removed. The method also includes forming a cap element above the metal gate stack and between the spacer elements.

In accordance with some embodiments, a method is provided. A method includes forming a gate electrode over a semiconductor substrate. Spacer elements are formed on sidewalls of the gate electrode. The gate electrode and the spacer elements are partially removed to form a recess between the spacer elements. The recess becomes wider along a direction from a bottom of the recess towards a top of the recess. A remaining portion of the gate electrode is removed such that the recess becomes deeper. A metal gate stack is formed in the recess after the remaining portion of the gate electrode is removed. A cap element is formed above the metal gate stack and between the spacer elements.

In accordance with some embodiments, a method is provided. The method includes forming a gate electrode over a semiconductor substrate. A first spacer element is formed on a first sidewall of the gate electrode. A second spacer element is formed on a second sidewall of the gate electrode. The second sidewall of the gate electrode is opposite to the first sidewall of the gate electrode. A first portion of the gate electrode is removed to form a first recess between the first spacer element and the second spacer element. A second portion of the gate electrode, a portion of the first spacer element and a portion of the second spacer element are removed to extend the first recess toward the semiconductor substrate. The first recess becomes narrower as the first recess extends toward the semiconductor substrate. A remaining portion of the gate electrode is removed to further extend the first recess toward the semiconductor substrate. After removing the remaining portion of the gate electrode, a dielectric layer is formed along a bottom and sidewalls of the first recess. A conductive material is deposited over the dielectric layer. The conductive material fills the first recess. The dielectric layer and the conductive material are recessed to form a second recess between the first spacer element and the second spacer element. A topmost surface of the conductive material is above a topmost surface of the dielectric layer after the recessing. A cap element is formed in the second recess.

In accordance with some embodiments, a method is provided. A method includes forming a gate electrode over an active region. A first spacer element is formed on a first sidewall of the gate electrode. A second spacer element is formed on a second sidewall of the gate electrode. The gate electrode is interposed between the first spacer element and the second spacer element. A first etching process is performed on the gate electrode to remove a first portion of the gate electrode. The first etching process exposes a sidewall of the first spacer element and a sidewall of the second spacer element. A second etching process is performed on the gate electrode, the first spacer element and the second spacer element. The second etching process removes a second portion of the gate electrode. The second etching process laterally etches the first spacer element and the second spacer element. A third etching process is performed on the gate electrode. The third etching process removes a remaining portion of the gate electrode and exposes a topmost surface of the active region. A first dielectric layer is formed along the topmost surface of the active region, the sidewall of the first spacer element and the sidewall of the second spacer element. A conductive material is deposited over the first dielectric layer and between the first spacer element and the second spacer element. A fourth etching process is performed on the first dielectric layer and the conductive material. A topmost surface of the conductive material is above a topmost surface of the first dielectric layer after performing the fourth etching process. A second dielectric layer is formed over the first dielectric layer and the conductive material, and between the first spacer element and the second spacer element.

In accordance with some embodiments, a semiconductor device is provided. The semiconductor device includes a gate stack over a semiconductor substrate. The gate stack includes a work function layer and a conductive fill layer. The work function layer extends along sidewalls and a bottommost surface of the conductive fill layer. A topmost surface of the conductive fill layer is above a topmost surface of the work function layer. The semiconductor device further includes a cap element over the gate stack. The cap element has a first width near the gate stack and a second width near an upper portion of the cap element. The second width is greater than the first width. A portion of the conductive fill layer extends above a bottommost surface of the cap element. The semiconductor device further includes a spacer element extending along a sidewall of the cap element and a sidewall of the gate stack. The spacer element has an inner sidewall closest to the sidewall of the gate stack. The inner sidewall has a lower portion with a first slope and an upper portion with a second slope. The second slope is less than the first slope. An interface between the lower portion and the upper portion is above a topmost surface of the conductive fill layer.

In accordance with some embodiments, a semiconductor device is provided. The semiconductor device includes a gate stack over a semiconductor substrate. The gate stack includes a work function layer and a conductive fill layer. The conductive fill layer is surrounded by the work function layer. A topmost surface of the conductive fill layer is above a topmost surface of the work function layer. The semiconductor device further includes a cap element over the gate stack. A portion of the cap element extends below the topmost surface of the conductive fill layer. A sidewall of the cap element has a lower portion with a first slope and an upper portion with a second slope. The second slope is less than the first slope. The semiconductor device further includes a spacer element has a first portion extending along a sidewall of the gate stack and a second portion extending along the sidewall of the cap element. A first portion of the spacer element has a first width. A second portion of the spacer element has a second width. The first width is greater than the second width.

In accordance with some embodiments, a semiconductor device is provided. The semiconductor device includes a gate stack over a semiconductor substrate. The gate stack includes a work function layer and a conductive fill layer. The work function layer extends along sidewalls and a bottommost surface of the conductive fill layer. A topmost surface of the conductive fill layer is above a topmost surface of the work function layer. The semiconductor device further includes a cap element over the gate stack. The cap element is in physical contact with the topmost surface of the work function layer. A width of the cap element increases as the cap element extends away from the topmost surface of the conductive fill layer and toward a topmost surface of the cap element. The semiconductor device further includes a spacer element on a sidewall of the cap element and a sidewall of the gate stack. The spacer element has an inner sidewall facing the sidewall of the gate stack and the sidewall of the cap element. The inner sidewall has a lower portion with a first slope and an upper portion with a second slope. The second slope is less than the first slope. At least a portion of the lower portion is above the topmost surface of the conductive fill layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a gate stack over a semiconductor substrate, the gate stack comprising a work function layer and a conductive fill layer, the work function layer extending along sidewalls and a bottommost surface of the conductive fill layer, a topmost surface of the conductive fill layer being above a topmost surface of the work function layer, the sidewalls of the conductive fill layer extending from the bottommost surface of the conductive fill layer to the topmost surface of the conductive fill layer, an entirety of each of the sidewalls of the conductive fill layer being a planar sidewall;
    a cap element over the gate stack, a dielectric material of the cap element being in physical contact with the topmost surface of the conductive fill layer, the cap element having a first width near the gate stack and a second width near an upper portion of the cap element, the second width being greater than the first width, a portion of the conductive fill layer extending above a bottommost surface of the cap element;
    a spacer element extending along a sidewall of the cap element and a sidewall of the gate stack, the spacer element having an inner sidewall closest to the sidewall of the gate stack, the inner sidewall having a lower portion with a first uniform slope and an upper portion with a second uniform slope, the second uniform slope being less than the first uniform slope, the upper portion of the inner sidewall extending from the lower portion of the inner sidewall to a topmost surface of the spacer element, an interface between the lower portion and the upper portion being above the topmost surface of the conductive fill layer, wherein the gate stack further comprises a gate dielectric layer, a first portion of the gate dielectric layer being interposed between the work function layer and the semiconductor substrate, a second portion of the gate dielectric layer being interposed between the work function layer and the spacer element, the topmost surface of the conductive fill layer being above a topmost surface of the gate dielectric layer, the topmost surface of the gate dielectric layer being level with the topmost surface of the work function layer; and
    a source/drain region extending into the semiconductor substrate, a top surface of the source/drain region being above a bottom surface of the spacer element.

2. The semiconductor device of claim 1, wherein the gate dielectric layer comprises hafnium oxide.

3. The semiconductor device of claim 1, wherein the work function layer comprises a metal nitride, a metal carbide, or an aluminide.

4. The semiconductor device of claim 3, wherein the metal nitride comprises titanium nitride or tantalum nitride.

5. The semiconductor device of claim 1, wherein the conductive fill layer comprises tungsten.

6. The semiconductor device of claim 1, wherein the upper portion of the inner sidewall and an imaginary plane extending from the lower portion of the inner sidewall towards a topmost surface of the cap element form an angle, and wherein the angle is in a range from about 1 degree to about 10 degrees.

7. The semiconductor device of claim 1, wherein the lower portion of the inner sidewall and a top surface of the semiconductor substrate form an angle, and wherein the angle is in a range from about 85 degrees to about 95 degrees.

8. The semiconductor device of claim 1, wherein the dielectric material of the cap element is in physical contact with the spacer element.

9. A semiconductor device, comprising:
    a gate stack over a semiconductor substrate, the gate stack comprising a work function layer and a conductive fill layer, the conductive fill layer being surrounded by the work function layer, a topmost surface of the conductive fill layer being above a topmost surface of the work function layer, the conductive fill layer having a sidewall extending from the topmost surface of the work function layer to the topmost surface of the conductive fill layer, an entirety of the sidewall of the conductive fill layer being a planar sidewall, wherein the gate stack further comprises a gate dielectric layer, the gate dielectric layer surrounding the work function layer, a topmost surface of the gate dielectric layer being level with the topmost surface of the work function layer;
    a cap element over the gate stack, a portion of the cap element extending below the topmost surface of the conductive fill layer, the portion of the cap element comprising a dielectric material, a sidewall of the cap element having a lower portion with a first uniform slope and an upper portion with a second uniform slope, the second uniform slope being less than the first uniform slope, the upper portion of the sidewall of the cap element extending from the lower portion of the sidewall of the cap element to a topmost surface of the cap element;

a spacer element having a first portion extending along a sidewall of the gate stack and a second portion extending along the sidewall of the cap element, the first portion of the spacer element having a first width, the second portion of the spacer element having a second width, the first width being greater than the second width; and a source/drain region extending into the semiconductor substrate, a top surface of the source/drain region being above a bottom surface of the work function layer.

10. The semiconductor device of claim 9, wherein a width of the cap element at the topmost surface of the conductive fill layer is in a range from about 25 nm to about 35 nm.

11. The semiconductor device of claim 9, wherein a width of the cap element at the topmost surface of the cap element is in a range from about 27 nm to about 37 nm.

12. The semiconductor device of claim 9, wherein the cap element comprises silicon nitride or silicon oxynitride.

13. The semiconductor device of claim 9, wherein the spacer element comprises silicon nitride, silicon oxynitride, or silicon oxide.

14. The semiconductor device of claim 9, wherein the cap element is in physical contact with the topmost surface of the gate dielectric layer and the topmost surface of the work function layer.

15. A semiconductor device, comprising:

a gate stack over a semiconductor substrate, the gate stack comprising a work function layer and a conductive fill layer, the work function layer extending along sidewalls and a bottommost surface of the conductive fill layer, a topmost surface of the conductive fill layer being above a topmost surface of the work function layer, the conductive fill layer having a uniform width as the conductive fill layer extends away from the topmost surface of the work function layer and toward the topmost surface of the conductive fill layer;

a cap element over the gate stack, a dielectric material of the cap element being in physical contact with the topmost surface of the work function layer, a width of the cap element increasing as the cap element extends away from the topmost surface of the conductive fill layer and toward a topmost surface of the cap element;

a spacer element on a sidewall of the cap element and a sidewall of the gate stack, the spacer element having an inner sidewall facing the sidewall of the gate stack and the sidewall of the cap element, the inner sidewall having a lower portion with a first uniform slope and an upper portion with a second uniform slope, the second uniform slope being less than the first uniform slope, the upper portion of the inner sidewall extending from the lower portion of the inner sidewall to a topmost surface of the spacer element, at least a portion of the lower portion being above the topmost surface of the conductive fill layer, wherein the gate stack further comprises a gate dielectric layer, a portion of the gate dielectric layer extending along the inner sidewall of the spacer element, the topmost surface of the conductive fill layer being above a topmost surface of the gate dielectric layer, the topmost surface of the gate dielectric layer being level with the topmost surface of the work function layer; and a source/drain region extending into the semiconductor substrate, a top surface of the source/drain region being above a top surface of the semiconductor substrate.

16. The semiconductor device of claim 15, wherein the topmost surface of the cap element is level with the topmost surface of the spacer element.

17. The semiconductor device of claim 15, wherein a width of the gate stack is in a range from about 25 nm to about 35 nm.

18. The semiconductor device of claim 15, further comprising a dielectric layer extending along an outer sidewall of the spacer element, the outer sidewall of the spacer element being opposite to the inner sidewall of the spacer element.

19. The semiconductor device of claim 18, wherein a topmost surface of the dielectric layer is level with the topmost surface of the cap element.

20. The semiconductor device of claim 15, wherein the cap element and the spacer element comprise silicon nitride.

* * * * *